(12) United States Patent
Mukhopadhyay et al.

(10) Patent No.: US 8,174,320 B1
(45) Date of Patent: May 8, 2012

(54) CURRENT SWITCHING SYSTEM

(75) Inventors: Rajarshi Mukhopadhyay, Allen, TX (US); Bryan E. Bloodworth, Coppell, TX (US); Reza Sharifi, Plano, TX (US); Pankaj Pandey, McKinney, TX (US); Taras Dudar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/023,313

(22) Filed: Feb. 8, 2011

(51) Int. Cl.
*H03F 3/04* (2006.01)
(52) U.S. Cl. ....................... 330/288; 323/315
(58) Field of Classification Search ................... 330/288
See application file for complete search history.

(56) References Cited

U.S. PATENT DOCUMENTS

| | | | |
|---|---|---|---|
| 6,778,016 B2 * | 8/2004 | Luo | 330/288 |
| 7,323,934 B2 * | 1/2008 | Huang | 330/257 |
| 7,636,016 B2 * | 12/2009 | Russell et al. | 330/288 |

* cited by examiner

*Primary Examiner* — Henry Choe
(74) *Attorney, Agent, or Firm* — Alan A. R. Cooper; Dawn V. Stephens; Frederick J. Telecky, Jr.

(57) ABSTRACT

A current switching system is described. This system includes first and second mirrored devices coupled to each other and a coupled terminal, and the first and second mirrored devices are coupled to an input terminal and an output terminal; a storage element in element in parallel with the first mirrored device and the first degeneration device; a variable impedance device coupled between the coupled terminal and a low voltage device; and a current mirroring accuracy enhancing circuit coupled between the coupled terminal and a high voltage device, wherein the variable impedance device dynamically changes a current at the coupled terminal to a second level depending when a threshold is met, and an impedance on the coupled terminal remains low both before switching and during switching.

5 Claims, 4 Drawing Sheets

CURRENT SWITCHING SYSTEM

DESCRIPTION OF RELATED ART

With the evolution of electronic devices, there is a continual demand for enhanced speed, capacity and efficiency in various areas including electronics especially for electronic devices that have multiple modes of operation, such as sleep, active and inactive. For efficient operation, a multi-mode electronic device should quickly switch between modes with minimal power consumption in sleep and inactive modes and minimal switching errors. Consequently, there remain unmet needs relating to switching systems for electronic devices.

BRIEF DESCRIPTION OF THE DRAWINGS

The current switching system may be better understood with reference to the following figures. The components within the figures are not necessarily to scale, emphasis instead being placed upon clearly illustrating the principles of the invention. Moreover, in the figures, like reference numerals designate corresponding parts or blocks throughout the different views.

Figure 1A:
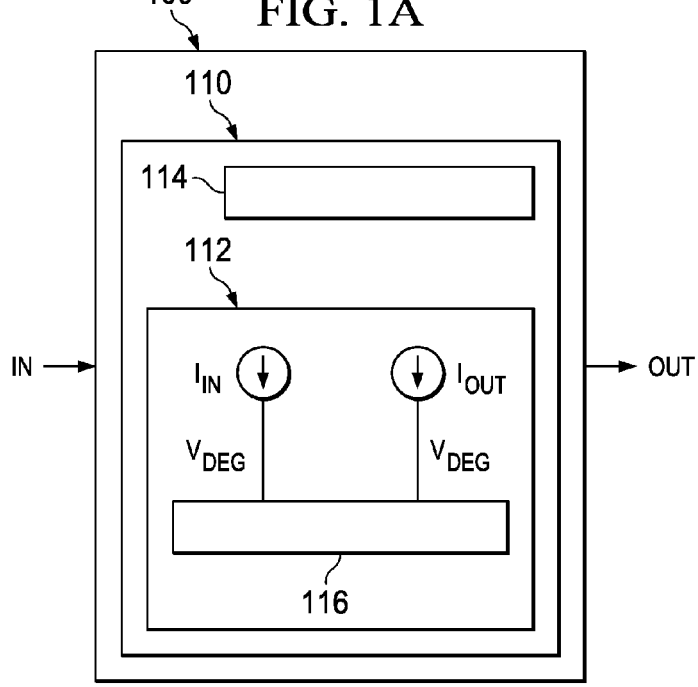
FIG. 1A is an illustrative environmental drawing illustrating for an electronic device with a current switching system.

While the current switching system is susceptible to various modifications and alternative forms, specific embodiments have been shown by way of example in the drawings and subsequently are described in detail. It should be understood, however, that the description herein of specific embodiments is not intended to limit the current switching system to the particular forms disclosed. In contrast, the intention is to cover all modifications, equivalents, and alternatives falling within the spirit and scope of the current switching system as defined by this document.

DETAILED DESCRIPTION OF EMBODIMENTS

As used in the specification and the appended claim(s), the singular forms "a," "an" and "the" include plural referents unless the context clearly dictates otherwise. Similarly, "optional" or "optionally" means that the subsequently described event or circumstance may or may not occur, and that the description includes instances where the event or circumstance occurs and instances where it does not.

FIG. 1A is an illustrative environmental drawing illustrating for an electronic device 100 with a current switching system 110. This electronic device may be any one of several types of electronic devices such as a wired/wireless transceiver, preamplifier system, or the like. It can be implemented in any of a variety of applications, such as audio and/or communications signal processing applications or magnetic disk-drive applications. The preamplifier system 100 receives an input signal IN and generates an output signal OUT that is an amplified version of the input signal IN. The input signal IN can be an analog signal from a magneto-electric source, such as an antenna or a magnetic disk. An additional amplification stage, a signal processor, or the like can receive the output signal OUT.

The preamplifier system 100 includes the current-switching system 110. The current-switching system 110 may include a current-mirror circuit 112 that generates an output current $I_{OUT}$ with a magnitude that is proportional to an input current $I_{In}$. The current-switching system 110 may also include a degeneration control circuit 114 configured to set a substantially constant magnitude of a degeneration voltage across degeneration resistance devices 116 in the current-mirror circuit 112. Using the current switching system 110, the preamplifier system 100 may facilitate the changing of modes. For example, in a magnetic disk drive application, the preamplifier system may transition from sleep mode to an inactive to an active mode, or sleep mode to an active mode.

Figure 1B:
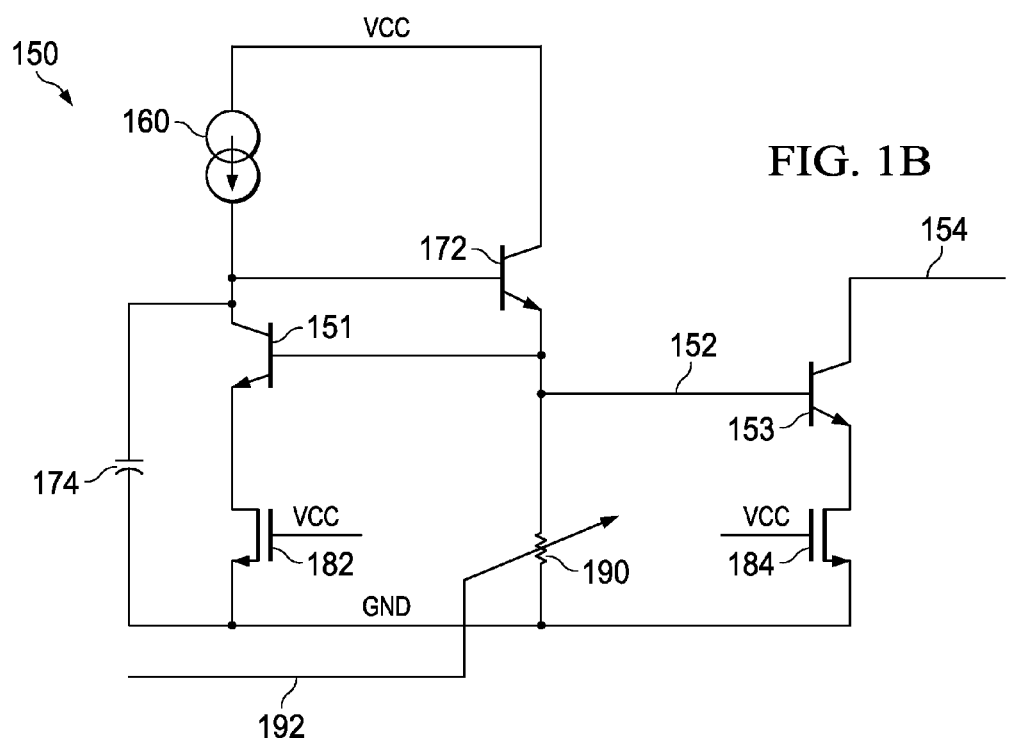
FIG. 1B is a circuit diagram of one implementation of the current switching system of FIG. 1A.

FIG. 1B is a circuit diagram 150 of one implementation of the current switching system 110. This current-switching system has two mirrored devices 151, 153. For this implementation, the mirrored devices are illustrated as bipolar junction transistors with a coupled terminal 152 that connects the transistor's bases. However, numerous alternative implementations may result by changing either the transistor type or the polarity. For example, the mirrored devices may be field effect transistors. An input current source connects to a high voltage supply, such as $V_{CC}$, and transmits an input current signal received by the mirrored device 151. This input current signal gets replicated and applied as an output signal on the output terminal 154.

The circuit diagram 150 also includes a current mirroring accuracy enhancing circuit, or beta helper 172, and compensation capacitor 174. In this implantation, the beta helper is shown as a single transistor, but numerous alternatives may exist by including more than one device or changing the type of device within the accuracy enhancing circuit. This circuit enhances the accuracy of the current switching system by supplying additional current on the coupled terminal 152 that essentially compensates for any depletion of the current level of the input signal when the mirrored devices are bipolar junction transistors. The compensation capacitor 174 may be positioned between a terminal of the beta terminal and a low voltage supply, such as GND. Using the compensation capacitor 174 is a stabilizer that increases the phase margin within a circuit loop made of the following devices: beta helper 172, mirrored devices 151, 152 and degeneration devices 182, 184. This compensation capacitor may have a size associated with any of the following characteristics: phase margin of the loop greater than 45•, typically 60• for output current to have no glitches and not exceed the steady state value, or the like.

Finally, the circuit diagram 150 includes degeneration devices 182, 184. These devices reduce inaccuracies that may occur in the output signal applied to the terminal 154. Though shown as a specific type of transistor, such as metal oxide semiconductor (MOS), and polarity, numerous alternative implementations may result from changing the transistor type and/or the polarity. These degeneration devices may have a size associated with any of the following characteristics: degeneration voltage or resistance required to compensate for matching inaccuracies of mirror transistor devices, good matching accuracy between degeneration devices themselves, or the like. The degeneration devices may include switches that turn off the current mirror in sleep or inactive mode to save power. Consequently, the current mirror consumes zero power in sleep or inactive modes. This circuit diagram also includes a variable impedance device 190, which may be a variable resistor, with an associated terminal

192. This terminal may be used for varying the impedance associated with this device. Typically, this resistance is high such that if the beta helper is implemented as a bipolar junction transistor, the beta helper's base current is relatively much smaller than the input current so as to maintain good current mirroring accuracy. The high resistance also reduces power consumption in steady state after switching in active mode. During switching from zero current to the desired output current, a low impedance is desired to avoid overshoot or glitches on the output current such that the output current never exceeds the desired current value. Low impedance also ensures faster settling or reduced switching time (e.g., less than 5 ns for magnetic disk preamplifiers), a parameter that is extremely critical and decides the overall inactive-to-active transition time in a system.

Figure 2:
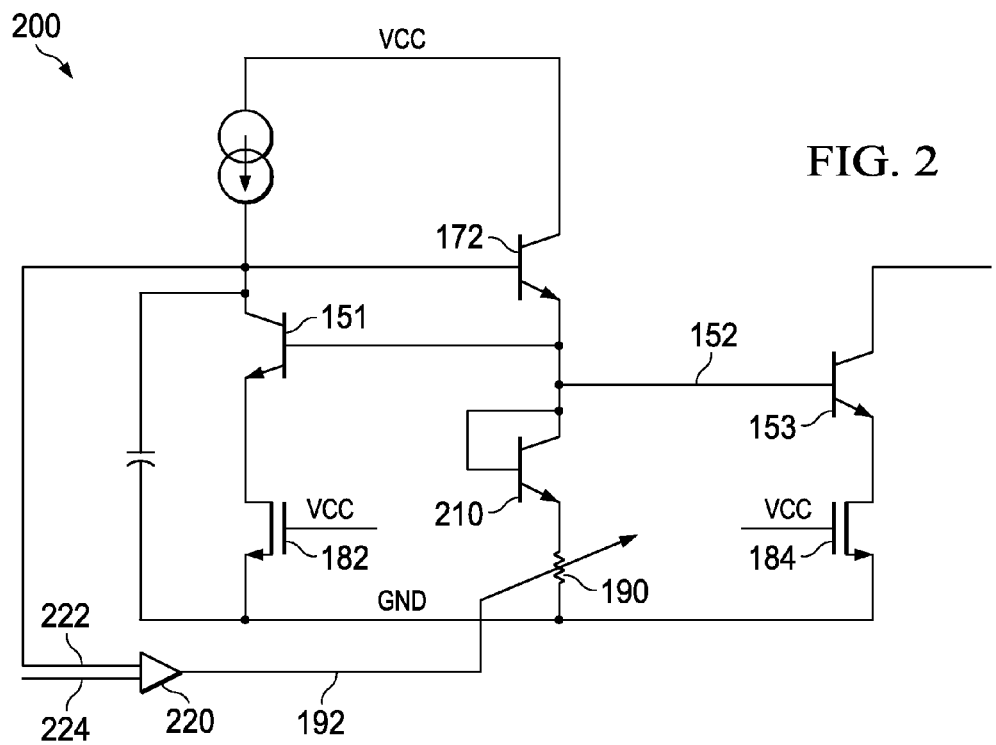
FIG. 2 is a circuit diagram of a second implementation of the current switching system of FIG. 1A.

FIG. 2 is a circuit diagram 200 of a second implementation of the current switching system 110 of FIG. 1A. This circuit diagram includes a switching device 210 that may be a diode connected bipolar junction transistor or some other suitable transistor. When this switching device is diode connected, then the looking impedance into the diode is given by 1/gm, i.e., low impedance. Low impedance helps with switching. In addition, the circuit diagram 200 includes a comparator 220 with input terminals 222, 224. Since the terminal 222 is coupled to the base of the beta helper, a feedback loop is formed. In contrast, a reference voltage may be applied to the reference terminal 224. The comparator 220 may apply a voltage signal to the terminal 192 that reflects the difference between the two input terminals 222, 224. When this difference exceeds a certain threshold, the impedance may be adjusted using the variable impedance device 190 such that this comparator provides control for the device 190. In sleep or inactive modes, the current mirror is turned off to consume zero power. When switching from inactive mode to active mode, the impedance at the base is kept low for two reasons: (1) to avoid overshoot or glitches on the output current such that the output current never exceeds the desired current value; (2) to ensure faster settling or reduced switching time (since the diode turns ON even with a very small current, typically few 100 nA, thus quickly raising the base voltage to VBE~0.7V from 0V. Typically, in steady state after switching, the base voltage needs to be ~1V for 300 mV of degeneration voltage). However, low impedance results in high power consumption in the beta helper leg. Hence, once the steady state voltages and currents are established in active mode, the comparator senses the voltages or currents and sends signal to increase the impedance. This helps in 2 ways: (1) It helps to reduce steady state power consumption; (2) The beta helper base current reduces and becomes relatively much smaller than the input current, which in turn improves the current mirroring accuracy.

Figure 3:
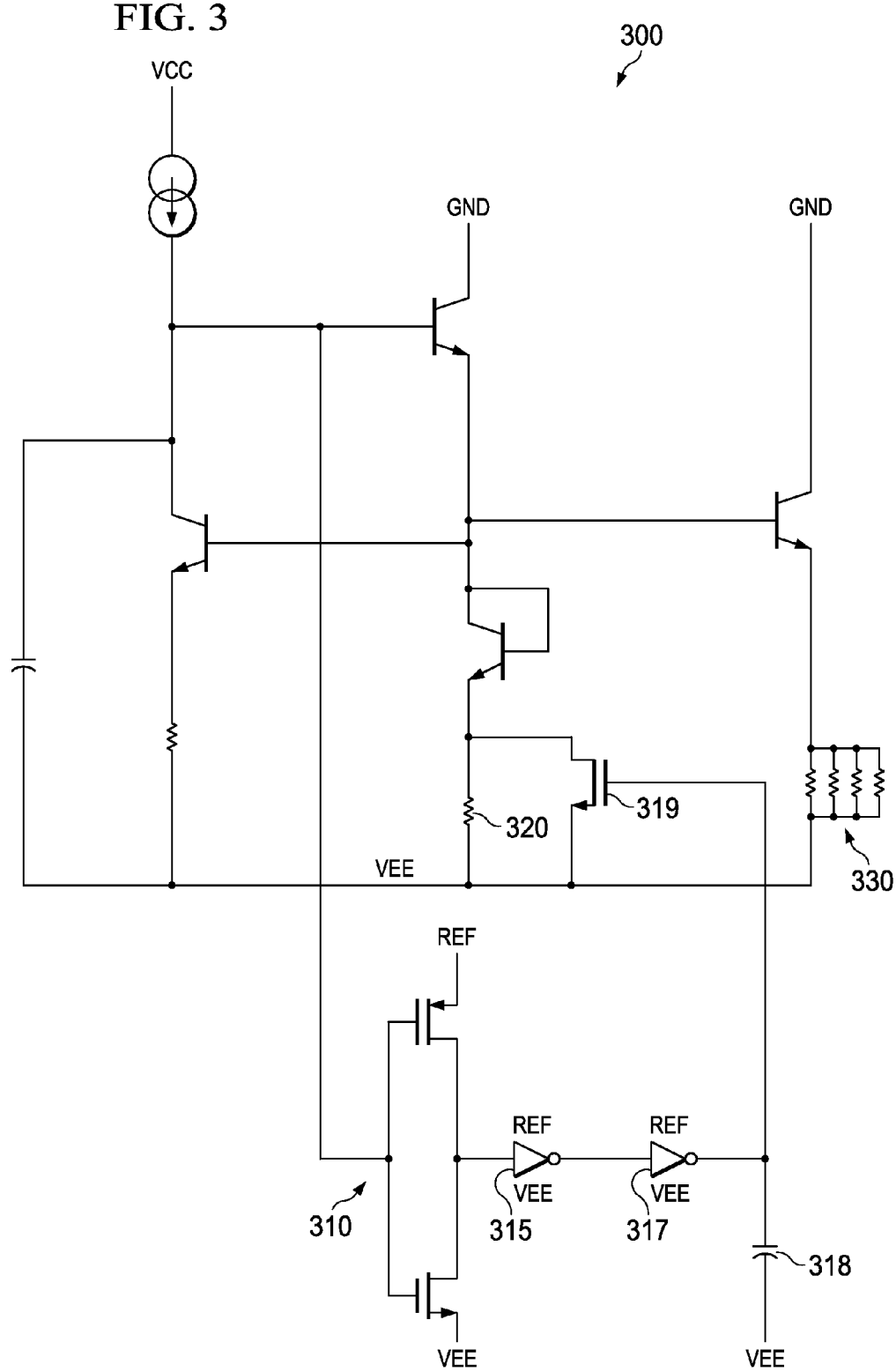
FIG. 3 is a circuit diagram of a third implementation of the current switching system of FIG. 1A.

FIG. 3 is a circuit diagram 300 of a third implementation of the current switching system 110. In this implementation, an inverter 310, delay device 315, delay device 317, and a storage device 319 may control the resistance. When the input to the inverter 310 has a low voltage, a high voltage signal passes through the two delay stages 315, 317 and activates the switch device, or transistor 319. When this transistor is on, the resistor 320 may be bypassed, which reduces the effective resistance. The inverter acts as a voltage comparator where the output logic level changes when the input voltage exceeds a certain threshold voltage determined by the relative sizing of the PMOS and NMOS transistors within the inverter. The sizing of the PMOS and NMOS transistors may be scaled relatively to give a desired trip point for the inverter 310. The delay may be implemented using a chain of CMOS inverters in case of digital control of resistance. The delay can be implemented using several techniques, such as inverter chain, RC-delay, etc. The delay can be adjusted depending on the design needs and challenges and for how much time high power consumption can be tolerated during switching. The capacitor at output of the CMOS inverter chain ensures that the digital switching signal has a slow transition. The slow transition ensures smooth switching without glitches while going from low impedance to high impedance. The resistors are sized as (Degeneration Voltage)/(Steady-State Current). For example, for a steady-state current of 1 mA across the leg and a degeneration voltage of 300 mV (typical number for good current mirroring accuracy), the total degeneration voltage would be ~300 Ohms. The resistor group 330 has four resistors in parallel indicating that the output current is four times the input current, though this group may include a different number of resistors.

Figure 4:
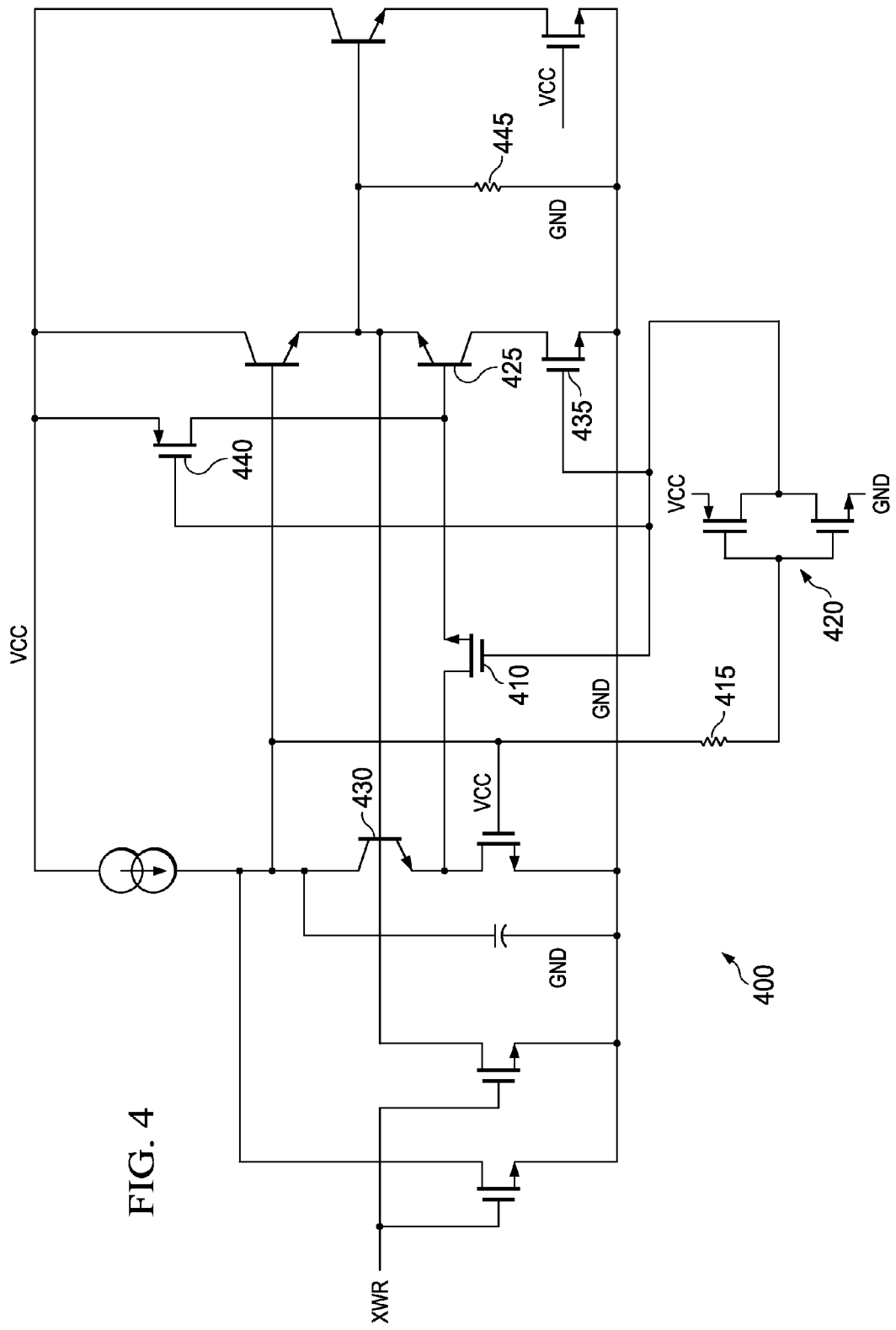
FIG. 4 is a circuit diagram of a fourth implementation of the current switching system of FIG. 1A.

FIG. 4 is a circuit diagram 400 of a fourth implementation of the current switching system 110. This circuit diagram includes a switching device 410, resistor 415, and inverter 420 where the inverter 420 forms a threshold comparator. The low impedance can also be implemented as a switching device 425, such as a PNP device, whose base connects to the emitter of the input NPN device, or switching device 430. The beta-helper leg thus forms a push-pull structure that forms an excellent current driver, and is extensively used in fast and high current drivers. While switching from inactive mode to active mode, the PNP 425 becomes active as soon as the base voltage of the input mirror device gets established, thus providing low impedance to ground. When the steady state values are reached, the PNP 425 can be shut down using switches or other schemes, and a parallel high resistance would remain to lower the power consumption. The threshold comparator formed by the inverter 420 controls the three MOSFET devices (such as device 410, 435, and 440) form a circuit to turn OFF the PNP in steady-state active mode, the impedance device 445 may be a 10 kOhm resistor forms the base resistance after PNP is turned OFF in steady-state active mode.

Figure 5:
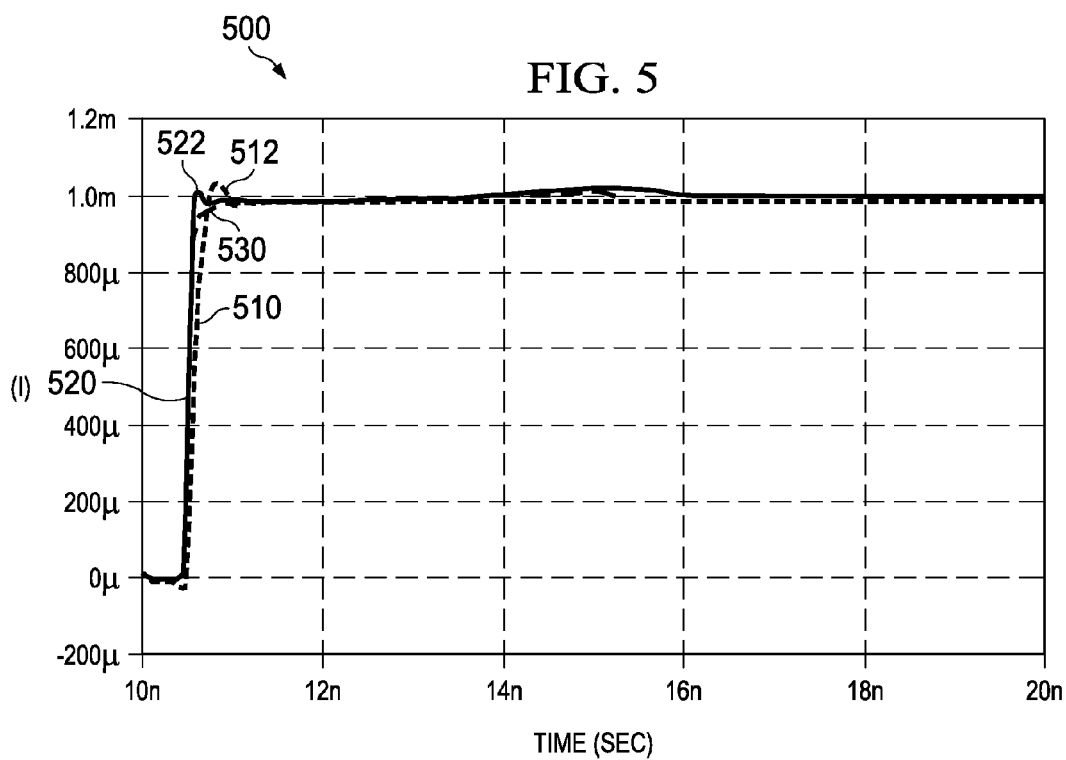
FIG. 5 is a graph of how the current varies with time for the current switching system of FIG. 1A.

FIG. 5 is a graph 500 of how the output current varies with time for various implementations of the current switching system 110. Plot 510 indicates how the current varies for the first implementation of the current switching system 110 associated with the circuit diagram 150 and described in FIG. 1B. As indicated by the sharp rise time, this current switching system has a fast switching time. In addition, the small region 512 demonstrates that this current switching system has a very low number of switching associated errors, or glitches. As indicated, the plot 510 settles at a current of approximately 1 mA and is approximately equal the input current of approximately 1 mA, which means this current switching system is a high accuracy system. The graph 500 also include a plot 520 associated with the circuit diagram 200 and the circuit diagram 300. This implementation has an even faster switching time as evidenced by the fact that it reaches approximately 1 mA of current before the plot 510. In addition, there are even fewer glitches, since the region 522 is smaller than the region 512. Finally, the plot 530 is associated with the circuit diagram 400 and has essentially now switching related errors and only a slightly longer rise time than the plot 520.

The current switching system 110 is enables efficient multi-mode electronic device that can quickly switch between modes with minimal power consumption and switching errors. For example, base impedance for an output mirror device, such as device 153 may be kept low both before and during switching. After switching and establishment of bias currents or voltages, the base impedance to circuit ground may be increased, which can reduce current flowing through the beta-helper, or device 172. Maintaining this low impedance can produce a better phase margin, a smaller compensation capacitor, and faster switching. The low impedance also results in smoother switching, which reduces switching errors associated with overshoot or glitches.

The current switching system 110 is enables fast switching. During switching, the switch connected to the diode at the base is ON. Thus, when the input current starts to grow, even for a very small current, the base voltage is established fast. Secondly, the diode connected at the base provides a low impedance path for the base node to ground, which increases the phase margin of the loop. Hence, the compensation capacitor needed for maintaining the same phase margin is substantially smaller than other solutions. The current switching system 100 has no overshoot, or glitches. The diode connected at the base provides a low impedance path for the base node to ground during switching, and helps in critical damping to avoid the base voltage/output current to overshoot/glitch. This is particularly beneficial for large current ranges. By design, the overshoot/glitch problem is taken care of over Process/Supply Voltage/Temperature (PVT) variations as well. In addition, the current switching system 110 does not consume additional power in the active mode. Instead, this system has lower power consumption in active mode that is achieved by reducing the base diode current after a time delay. The delay is implemented as a feedback circuit that senses whether the bias current/base voltage has been established. The delay can be implemented using several techniques, such as inverter chain, RC-delay, etc. The switching OFF of base diode current can also be implemented as an independent delay.

Finally, the current switching system has Zero power consumption in sleep or inactive mode. The current switching scheme can be completely shut down in sleep mode or inactive mode to consume zero power. This can be possible since the switching techniques disclosed enable smooth and fast switching from a completely off state, in contrast to other switching techniques that may need trickle currents to keep current mirror on in sleep mode or inactive mode. High current mirroring accuracy: The current mirroring accuracy quite effective. Current mirroring inaccuracy occurs whenever a large base current is drawn away from the input current by the beta-helper device. In the proposed solution, the large current through the base diode is switched OFF during steady state operation, and a higher resistance is connected to the diode that limits the diode current. Hence, the current mirroring accuracy is high. The degeneration & the resistance at the diode leg can be implemented using MOSFETs as well.

While various embodiments of the current switching system have been described, it may be apparent to those of ordinary skill in the art that many more embodiments and implementations are possible that are within the scope of this system. Although certain aspects of the current switching system may be described in relation to specific techniques or structures, the teachings and principles of the present system are not limited solely to such examples. All such modifications are intended to be included within the scope of this disclosure and the present current switching system and protected by the following claim(s).

The invention claimed is:

1. A current switching system, comprising:
   first and second mirrored devices coupled to each other and a coupled terminal, and the first and second mirrored devices are coupled to an input terminal and an output terminal;
   a first storage element in element in parallel with the first mirrored device and the first degeneration device;
   a diode connected switching device coupled to the coupled terminal;
   a first impedance device coupled between the diode connected switching device and a low voltage supply;
   a first switching device in parallel with the first impedance and having a control terminal;
   a delay circuit having an input and an output, wherein the output is coupled to the control terminal;
   an inverter coupled between the input terminal and the input of the delay circuit;
   wherein the inverter and the delay circuit dynamically change a current at the coupled terminal to a second level depending when a threshold is met, and
   an impedance on the coupled terminal remains low both before switching and during switching.

2. The current switching system of claim 1, further comprising a resistor group coupled between the output terminal and the low voltage supply.

3. The current switching system of claim 2, wherein the resistor group comprises four parallel resistors.

4. The current switching system of claim 1, wherein the delay circuit comprises two delay devices.

5. The current switching system of claim 1, further comprising a second impedance device coupled between the first mirrored device and the low voltage supply.

* * * * *